(12) United States Patent
Epstein et al.

(10) Patent No.: US 8,808,861 B2
(45) Date of Patent: Aug. 19, 2014

(54) LAMINATE COMPOSITE AND METHOD FOR MAKING SAME

(75) Inventors: Arthur J. Epstein, Bexley, OH (US); Chi-Yueh Kao, Columbus, OH (US); Yong G. Min, New Albany, OH (US)

(73) Assignee: The Ohio State University, Columbus, OH (US)

( * ) Notice: Subject to any disclaimer, the term of this patent is extended or adjusted under 35 U.S.C. 154(b) by 349 days.

(21) Appl. No.: 13/300,228

(22) Filed: Nov. 18, 2011

(65) Prior Publication Data
US 2012/0126920 A1    May 24, 2012

Related U.S. Application Data

(60) Provisional application No. 61/415,280, filed on Nov. 18, 2010.

(51) Int. Cl.
*H01F 1/42*    (2006.01)
(52) U.S. Cl.
CPC ........................................ *H01F 1/42* (2013.01)
USPC ........................................ 428/411.1; 335/296
(58) Field of Classification Search
CPC .......................................................... H01F 1/42
See application file for complete search history.

(56) References Cited

U.S. PATENT DOCUMENTS

| | | |
|---|---|---|
| 6,660,375 B1 | 12/2003 | Miller et al. |
| 7,754,563 B2 | 7/2010 | Nakanishi |
| 2004/0109350 A1 | 6/2004 | Epstein |
| 2005/0180992 A1 | 8/2005 | Belcher et al. |
| 2006/0196021 A1 | 9/2006 | Touzov et al. |
| 2007/0069186 A1 | 3/2007 | Alocilja et al. |
| 2007/0278628 A1* | 12/2007 | Katti .............................. 257/659 |
| 2008/0241531 A1 | 10/2008 | Belcher et al. |
| 2009/0076171 A1 | 3/2009 | Zhao et al. |
| 2009/0156756 A1 | 6/2009 | Alocilja et al. |
| 2011/0068291 A1 | 3/2011 | Park et al. |

OTHER PUBLICATIONS

Bin Li et al., "Magnetoresistance in an All-Organic-Based Spin Valve," Advanced Materials 2011, 23, pp. 3382-3386, wileyonlinelibrary.com.

Jung-Woo Yoo et al., "Spin Injection/Detection Using an Organic-Based Magnetic Semiconductor," Nature Materials, vol. 9, Aug. 2010, nature.com.

(Continued)

*Primary Examiner* — Ramsey Zacharia
(74) *Attorney, Agent, or Firm* — Wood, Herron & Evans, LLP

(57) ABSTRACT

An organic-based magnet is formed by molecular layer deposition (MLD) of a first compound and MLD of a second compound. The first or second compound containing a metal-containing compound. The first and second compounds being reactive with each other to form a first layer organic-based magnet. A laminate composite includes a first monolayer including a metal bonded to a magnet forming organic compound. A second monolayer may be in direct contact with the first monolayer. One of the first monolayer and the second monolayer having an induced magnetization when exposed to a magnetic field. A device includes the laminate composite and a nonmagnetic film thereon. A method of making an organic magnet on a substrate in a vacuum chamber includes depositing a first layer of metal-containing compound on the substrate by MLD.

19 Claims, 11 Drawing Sheets

(56) References Cited

OTHER PUBLICATIONS

Lei Fang et al., "Electrical Spin Injection from an Organic-Based Ferrimagnet in a Hybrid Organic-Inorganic Heterostructure," Physical Review Letters, 2011 American Physical Society, PRL 106, 156602 (2011), week ending Apr. 15, 2011.

Jung-Woo Yoo et al., "Photoinduced Magnetism and Random Magnetic Anisotropy in Organic-Based Magnetic Semiconductor V(TCNE)x Films, for x ~ 2," Physical Review Letters, 2007 The American Physical Society, PRL 99, 157205 (2007), week ending Oct. 12, 2007.

Jung-Woo Yoo et al., "Multiple Photonic Responses in Films of Organic-Based Magnetic Semiconductor V(TCNE)x, x~2," Physical Review Letters, 2006 The American Physical Society, PRL 97, 247205 (2006), week ending Dec. 15, 2006.

* cited by examiner

LAMINATE COMPOSITE AND METHOD FOR MAKING SAME

CROSS REFERENCE TO RELATED CASES

This application claims priority to U.S. Provisional Patent Application Ser. No. 61/415,280 filed Nov. 18, 2010, the disclosure of which is incorporated by reference herein in its entirety.

TECHNICAL FIELD

The present invention generally relates to magnets, and more specifically, organic-based magnets and methods for making such magnets and in particular, laminates of organic magnets.

BACKGROUND

Spintronics or spin electronics represent a new generation of electronic, solid-state devices that utilize an intrinsic spin and magnetic moment of an electron, as well as the electron's charge. It is anticipated that spintronic devices will be smaller, more versatile, and have superior properties compared to their semiconductor counterparts. These properties may include reduced power consumption due to their inherent nonvolatility, more rapid switching speed, and a larger number of carriers.

Giant magnetoresistance (GMR) structures represent one known spintronic device that consists of magnetic films separated by a nonmagnetic layer. An applied magnetic field produces huge changes in the electric resistance of the magnetic films essentially turning on or turning off electron flow through the device. In this regard, GMR devices operate by switching the magnetization direction in the magnetic films by means of an external magnetic field in close proximity to the device. By switching the magnetic field, the electrical resistance of the device can be changed dramatically. This effect is exploited in some recording devices, such as, in computer hard disks. There are other devices that utilize this characteristic.

For example, a magnetic version of a random access memory (RAM) device may utilize a similar effect. Unlike many current RAM devices, a magnetic random access memory device would be nonvolatile, no information is lost when the power is switched off. One structure of this device includes two magnetic films separated by an insulating metal-oxide film. The electrons may tunnel through the metal-oxide layer when the magnetization of each of the magnetic films is properly oriented. Still another device may include magnetic films that sandwich a semiconductor material layer, like a silicon layer. This construction may form a hybrid device that may behave like a conventional transistor to be used in computing.

The pursuit of spintronics, however, has been hampered by poor properties and manufacturing methods. For example, in semiconductor spintronics, there have been intensive efforts to develop room-temperature magnetic semiconductors and carbon-based materials as spin-transporting channels, with only limited success. In particular, there is a focus on organic-based magnets, because organic-based magnets allow chemical tuning of the electronic and magnetic properties of the magnetic films. However, to incorporate these materials, quality thin films of the material must be made and, as yet, are generally unavailable.

In this regard, there remains a need for organic-based magnetic films with improved performance and methods for making such films, which are both cost effective and scalable.

SUMMARY OF THE INVENTION

In one embodiment of the invention, an organic-based magnet is formed by molecular layer deposition of a first compound and molecular layer deposition of a second compound, the first compound or the second compound including a metal-containing compound. The first compound and the second compound are reactive with each other to form a first layer organic-based magnet. In one embodiment, a second layer organic magnet deposited by molecular layer deposition on the first layer organic-based magnet.

In one embodiment, a laminate composite comprises a first monolayer including a first metal bonded to a first magnet forming organic compound. The composite further comprises a second monolayer in direct contact with the first monolayer. The second monolayer includes a second metal bonded to a second magnet forming organic compound. The first monolayer and the second monolayer form a film having an induced magnetization when exposed to a magnetic field. In one embodiment, the first monolayer and/or the second monolayer is about one metal-organic molecule thick.

In one embodiment, a device comprises the laminate composite and a nonmagnetic film on the laminate composite.

In one embodiment, a laminate composite on a substrate comprises a first monolayer on the substrate including a first metal from a first metal-containing compound reacted with a first organic compound from a first organic-containing compound. The laminate composite further comprises a second monolayer on the first monolayer. The second monolayer includes a second metal from a second metal-containing compound reacted with a second organic compound from a second organic-containing compound. The first monolayer and the second monolayer having an induced magnetization when exposed to a magnetic field.

In one embodiment, a method of making an organic magnet on a substrate in a vacuum chamber comprises depositing a first layer of metal-containing compound on the substrate by molecular layer deposition. The method further comprises depositing a magnet forming organic-containing compound by molecular layer deposition of the first layer. The organic of the organic-containing compound bonds with the metal of the metal-containing compound. The metal of the metal-containing compound adheres to the substrate and a portion of the metal-containing compound evolves prior to or during the depositing of the organic-containing compound. The bonded metal-organic compound forms a monolayer on the substrate.

BRIEF DESCRIPTION OF THE DRAWINGS

The accompanying drawings, which are incorporated in and constitute a part of this specification, illustrate embodiments of the invention and, with the general description given above, together with the detailed description given below, serve to explain various aspects of the invention.

DETAILED DESCRIPTION

Figure 1:
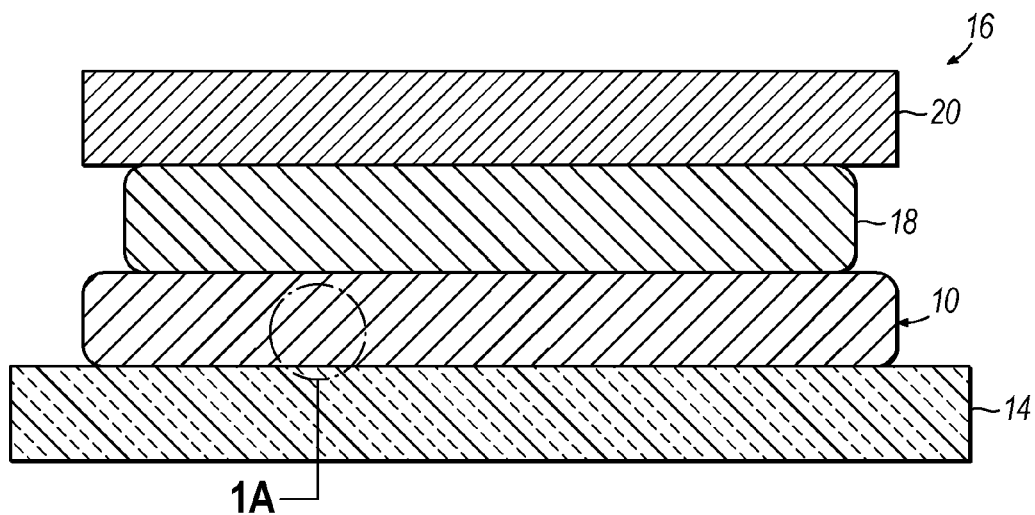
FIG. 1 is schematic cross-sectional view of one embodiment of the invention.
Figure 1A:
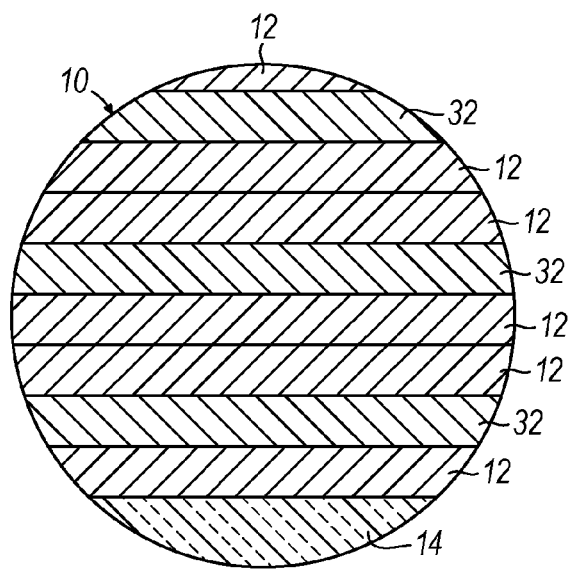
FIG. 1A is an enlarged view of the encircled area 1A of FIG. 1.
Figure 2:
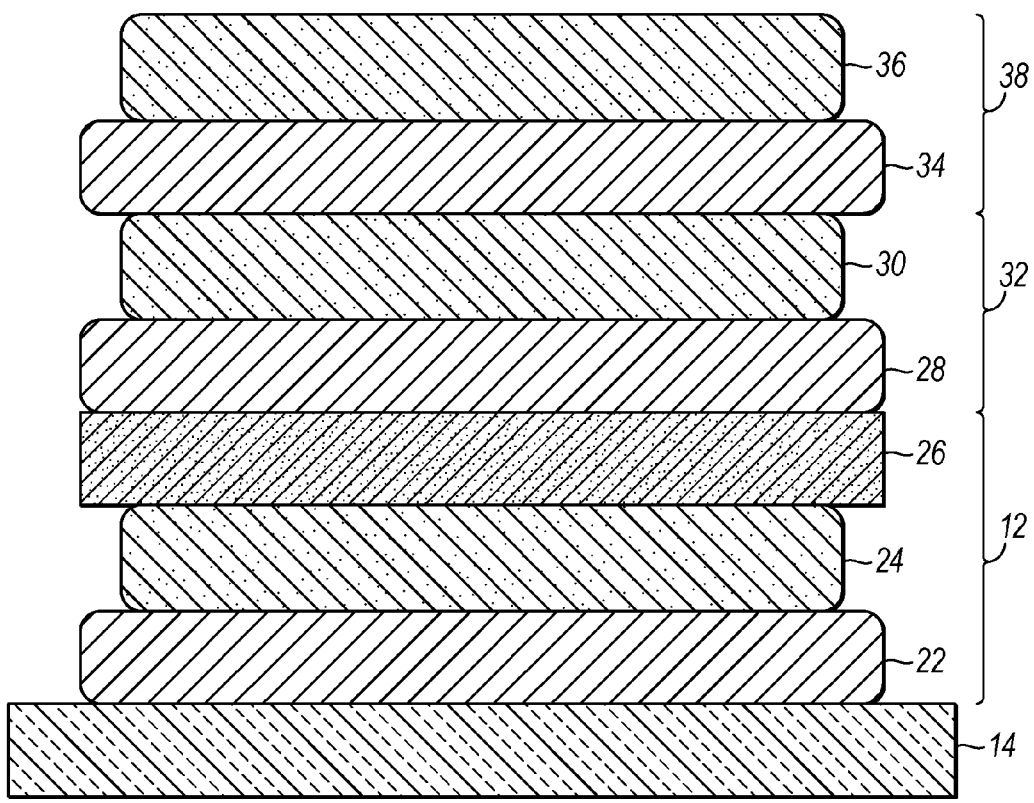
FIG. 2 is a schematic cross-sectional view of one embodiment of the invention.

With reference to FIGS. 1, 1A, and 2, a method for producing finely-controlled film growth so as to form a laminate composite organic-based magnet 10 includes alternately depositing layers of a metal-containing compound and an organic-containing compound, reacting or combining the metal-containing compound and the organic-containing compound to form a monolayer 12 (FIG. 1A), which includes the metal from the metal-containing compound and an organic compound from the organic-containing compound. Organic-based magnets are at least partly organic though they may contain elemental metal and other non-organic compounds. The monolayer 12, and the method by which it is formed, is described in detail below. Generally, however, the laminate composite 10 may be made by laminating or stacking multiple monolayers 12 on one another. The laminate composite 10 may be formed on a substrate 14 as a portion of a device 16 and may be included in the device 16 with one or more films, such as first film 18 and second film 20 as shown in FIG. 1 and set forth in detail below.

To that end, in general, in one embodiment and as depicted in FIGS. 1, 1A, and 2, a layer 22 of a metal-containing compound may be initially deposited on the substrate 14. The layer 22 may be in continuous and direct contact with the substrate 14, as shown. To the layer 22, a layer 24 of an organic-containing compound may be deposited in direct and continuous contact with the layer 22. The layer 22 and the layer 24 may react to form the monolayer 12. That is, one of each of the layer 22 and the layer 24 are required to form the monolayer 12, as set forth in detail below. It will be appreciated that layers 22 and 24 may be reversed from that shown in FIG. 2. In this regard, embodiments of the present invention are not limited to the specific order shown. Furthermore, additional layers (not shown) may separate the above-identified layers. In addition, it will be appreciated that the areas of each of the layers 22, 24 may not be coextensive with each other or with the surface of the substrate 14 and embodiments of the present invention are not limited thereto.

Figure 15A:
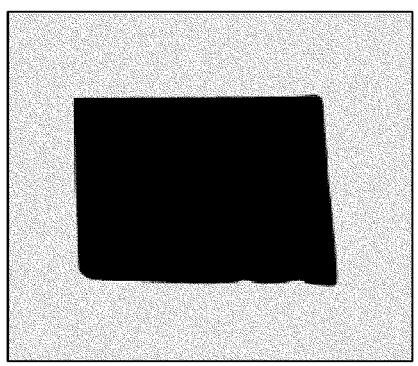
FIGS. 15A and 15B are photographs of a laminate composite organic-based magnet on a silicon wafer (left photo) and on a PTFE film (right photo, respectively.
Figure 15B:
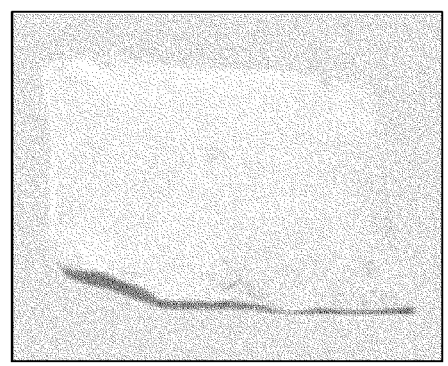

With continued reference to FIGS. 1, 1A, and 2, in one embodiment, the substrate 14 may include a material sufficiently compatible with the material of layer 22 deposited on the substrate 14. In one embodiment, the substrate 14 may include a previously deposited film or layer. By way of example, the substrate 14 may include both rigid and flexible materials. Rigid materials may include substrates of, for example, glass, silicon, germanium, combinations of silicon and germanium, quartz, sapphire, gallium arsenide (GaAs), and gallium nitride (GaN), that do not readily deform or flex. It will be appreciated that glass, when formed in thin sheets or fibers, may be considered "flexible." So, the term rigid should not exclude a material because of its specific configuration. Rather, the term rigid may refer to the elastic modulus of the material, with rigid materials having a large elastic modulus. Other rigid materials may include, for example, glass-reinforced epoxy laminate sheets, such as, FR-4. Alternatively, the substrate 14 may be of a material that is considered flexible or has a lower modulus of elasticity. These may include plastic materials, such as poly(methyl methacrylate) (PMMA), polystyrene (PS), and polycarbonate (PC), among others. By way of further example, flexible substrates may further be made of polyimide; polyethylene terephthalate (PET); a polyamide, such as, Nylon; polyimides; polyethylene (PE); polyethyleneoxide (PEO); polytetrafluoroethylene (PTFE); polyethylene naphthalate (PEN); Polyphenylene oxide (PPO); Polybutylene terephthalate (PBT); Polysulphone (PSU); polymer/filler blends having some fraction of polypropylene, polyethylene, block copolymer polypropylene, rubber, and a reinforcing filler, such as, thermoplastic polyolefin; and polyether ether ketone (PEEK), among others. FIGS. 15A and 15B depict exemplary laminate composites deposited on a rigid substrate, i.e., silicon (left photo), and on a flexible substrate, i.e., a PTFE film (right photo), respectively.

In one embodiment, the substrate 14 may be cut to size and cleaned prior to depositing the layer 22 thereon. For example, the substrate 14 may be cleaned with a solvent, such as, acetone, isopropanol, and/or deionized water. The substrate 14 may be exposed to UV-ozone cleaning followed by rinsing with deionized water. After rinsing, the substrate 14 may be dried with nitrogen gas. In addition, the surface of the substrate 14 may be subject to preprocessing. By way of example, a silica layer may be deposited on a silicon substrate in an argon-filled environment before being rinsed with deionized water. Furthermore, cleaning in a level-1000 clean room may facilitate subsequent deposition of the layers 22 and 24.

Referring to FIG. 2, in one embodiment, the metal-containing compound of layer 22 may be deposited by a molecular layer deposition (MLD) process on the substrate 14, as described above. In an MLD process, a single molecular layer is deposited on a substrate. To form a magnet, a single metal-containing layer is deposited followed by a single organic (magnet forming) compound. This forms a molecular layer of the metal-organic compound which is the organic magnet. Depositing may be achieved with or without the assistance of a separate flow of a carrier gas, for instance, argon.

Specifically with regard to the layer 22, the metal of the metal-containing compound deposited on the substrate 14 may include a transition metal, for example, vanadium (V), iron (Fe), nickel (Ni), manganese (Mn), chromium (Cr), and/or cobalt (Co). Other transition metals may include those identified in Groups 3 to 12 (IUPAC designation) of the Period Table, including the Lanthanides and the Actinides, and may preferably include electron-rich transition metals, for example, Group 3 to 10 transition metals. Alternatively, or in addition to transition metals, the metal may include rare earth metals. During deposition, during a subsequent reaction, or as a result of decomposition, a metal from the layer 22 may bond or adhere to the substrate 14. By way of example, in this regard, vanadium may be deposited as a vanadium-containing compound. The vanadium-containing compound may decompose during the deposition process, during a subsequent process, or during a reaction such that elemental vanadium resides on the substrate 14. In one embodiment, the vanadium-containing compound may be vanadium hexacarbonyl (e.g., $V(CO)_6$), which may form a vanadium carbonyl-containing layer on the substrate 14. The carbonyl may subsequently decompose leaving residual, elemental vanadium on the substrate 14. Other transition metal carbonyls may be similarly deposited and contain the metal of the metal carbonyl. Alternatively, for example, benzene complexes of transition metals, such as, $V(C_6H_6)_2$, may be deposited via MLD.

Following deposition of the layer 22, the organic-containing compound may be deposited to form layer 24 on the layer 22, as shown in FIG. 2. The organic-containing compound is one that is effective to form an organic magnet. Generally, these are compounds with several unsaturated groups, such as, cyano, aryl, and so on. These compounds are well known. The organic of the organic-containing compound may react with the metal of the layer 22 to form the monolayer 12, shown in FIGS. 1A and 2. The monolayer 12 may therefore include the metal from the layer 22 and the organic from the layer 24 and may form a metal-organic compound. The monolayer 12 may form all or a portion of the laminate composite 10 of FIG. 1. It will be appreciated that there may be many different metal-organic compounds that may be formed during the reaction of the layers 22 and 24. By way of example, the suitable organic-containing compounds may include one of tetracyanoethylene (TONE), tetracyanoquinodimethane (TCNQ), tetracyanobenzene (TCNB), tetracyanopyrazine (TCNP), hexacyanobutadiene (HCBD), methyltricyanoethylenecarboxylate (MeTCEC), 2-(x-fluorophenyl)-1,1,2-tricyanoethylene, (x:-, di-, tri-, tetra-, penta-) (x-FPTCE), (i-hexacyanodivinylbenzene) (i-HCDVB), and/or 3,3'-di-(1,1,2-tricyanovinyl)azobenzene (DCTVAzo). In one exemplary embodiment, with reference again to a vanadium-containing compound, as set out above, once the vanadium-containing compound is deposited, a layer of TONE may be deposited over all or a portion of the previously deposited vanadium-containing compound. The TCNE may react with the vanadium to form a monolayer of V[TCNE]x.

Advantageously, while not being bound by theory, the deposition and reaction between the layers 22 and 24 may be self-limiting. This self-limiting nature is thought to allow the thickness of the laminate composite 10 to be precisely controlled. In addition, this feature may also provide a mechanism by which the laminate composite 10 may be smooth and pinhole free even on substrates with very high aspect ratios, for example, greater than about 10.

With reference to FIG. 2, additional layers 22, 24 may be likewise deposited and reacted on the previously formed monolayer 12. Thus, by building up or stacking the monolayers 12, the laminate composite 10 shown in FIG. 1 may be formed. As set forth above, any additional layer 22 and 24 may also include the same metal-containing compound and organic-containing compound. In this regard, the chemical composition within the laminate composite 10 (FIG. 1) may be constant through thickness with each of the combined layers 22 and 24 resulting in a discrete, distinguishable monolayer 12 within the composite 10.

However, any additional layer 22, 24 may be of a different metal and/or a different organic compound. In this regard, the laminate composite 10 may include a plurality of monolayers 12 of different metal-organic compounds. Thus, the chemical composition may vary by monolayer. This feature allows precise control over the composition of the laminate composite 10 and the variation of the composition through the thickness of the laminate composite 10. By way of example, a cobalt-containing compound and TCNE may form subsequent layers 28 and 30, respectively, to provide a monolayer 32 of Co[TCNE]x on a previously formed V[TCNE]x monolayer. The laminate composite 10 would thus be a lamination of individual monolayers of Co[TCNE]x and V[TCNE]x. Each monolayer may have a discrete chemical composition specific to the layers used to form the monolayer 12, 32.

In one embodiment, additional layers, such as, layers 34 and 36 may be deposited in accordance with previously deposited layers 22 and 24 and/or layers 28 and 30. Layers 34 and 36 may include the same or different transition metals and organic compounds as any preceding layer 22, 24, 28, or 30 or a combination thereof. Layers 34 and 36 may form a monolayer 38. Accordingly, the laminate composite 10 may include multiple monolayers of different metal-organic compounds. For example, a combination of Co, Ni, Fe, and/or V[TCNE]x compounds each formed by a self-limiting reaction between adjacent, deposited layers, for example, between layers 22 and 24, between layers 28 and 30, and/or between layers 34 and 36. The laminate composite 10 may, therefore, be a lamination of three or more different metal-organic monolayers.

In this manner, the thickness of the laminate composite 10 may be built up through multiple individual layers 22 and 24, 28 and 30, and/or 34 and 36 forming discrete monolayers 12, 32, 38 of one or different metal-organic compounds, as set forth above. By the MLD process, the monolayers 12 have a thickness or dimension of about one metal-organic molecule, for example, the monolayer 12 may be about one V[TCNE]x molecule thick. With subsequent depositions or cycles, a composite laminate of individual, single monolayers of V[TCNE]x and/or other metal-organic compound monolayers may be formed. In this regard, the thickness of the laminate composite 10 may be depend on the number of deposition cycles performed, that is, on the number of combined cycles for depositing layers 22 and 24, layers 28 and 30, and/or layers 34 and 36. By way of example, for a V[TCNE]x laminate composite, the thickness may be on the order of 50 nm for about 50 cycles (i.e., about 50 paired cycles of layers 22 and 24). Thinner composite laminates may also be achieved with fewer cycles while thicker composite laminates may be achieved with additional cycles.

The properties of the laminate composite 10, as set forth above, exceed those measured from other deposition processes. The laminate composite 10 may exhibit a magnetization when exposed to a magnetic field. By way of example, the coercivity of the laminate composite 10 may be from about 80 Oe to about 190 Oe. The temperature dependence of the laminate composite 10, as measured with a superconducting quantum interference device (SQUID) may be up to 400 K before any significant drop in the magnetization is observed, which suggests that embodiments of the laminate composite are more thermally stable than films made via CVD and PVD, for example. The time-dependent resistance, measured over a period of five days, indicates that the laminate composite 10 may be more air stable than CVD films.

In addition to layers 22 and 24, an optional layer 26 may be interposed between layers 22 and 24 or on top of layer 24, as shown in FIG. 2. The layer 26 may alternatively be deposited on or between any of the additional layers 28, 30, 34, and 36, when present. The layer 26 may include an associating element that may be used to enhance the thermal stability, air stability, electrical conductivity, thermal conductivity, surface smoothness, optical properties, and/or magnetic properties of any of the monolayers 12, 32, 38. For instance, during depositing, the layer 26 may be deposited on the layer 24. The associating element may include one or more elements of oxygen (O), nitrogen (N), sulfur (S), selenium (Se), arsenic (As), phosphorous (P), chlorine (Cl), fluorine (F), calcium (Ca), scandium (Sc), titanium (Ti), chromium (Cr), manganese (Mn), iron (Fe), zinc (Zn), aluminum (Al), gold (Au), silver (Ag), copper (Cu), cobalt (Co), vanadium (V) and other transition metals, and rare earth metals.

As set forth above, the laminate composite 10 may form all or a portion of the device 16 (FIG. 1). In this regard, the device 16 may include the laminate composite 10 of a plurality of monolayers 12 alone or in combination with one or more films adjacent the laminate composite 10. By way of example, the device 16 may include the film 18 which may be a non-magnetic material, a metal-oxide, or a semiconductor. The additional film 20 may be deposited on the film 18 and may include a second laminate composite, such as V[TCNE]x, as set forth above, or of a different metal-organic compound. It will be appreciated that the additional films 18 and/or 20 or another film or structure (not shown) may be deposited by MLD or another technique to be used as electrodes for electrically connecting the device 16 to an electrical circuit.

Because of the advantageous properties set out above, including air stability, high temperature, high magnetic performance, flexibility, and the chemical tuning of those properties, the laminate composite 10 may be uniquely suited for use in spintronics generally, as set out above, including in security applications, such as, in terahertz imaging Imaging/Sensing; in spin-thermolelectric generators; in spin-organic photovoltaic cell applications; in spin-thin film transistor applications; in spin-light emitting diode applications; in electromagnetic interference shielding applications; in spin-torque transfer RAM (SPRAM); in magnetoresistive random access memory (MRAM) applications; and in photonic-controlled spintronics.

By way of example only, laminate composite organic magnet compositions suitable for use in thermolelectric devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, and other metal-organic layers plus any other organic metallic materials since there is no requirement on magnetic performance beyond the amount of unpaired spin per each metal site and each organic site. It will be appreciated that it is advantageous for thermoelectric applications due to their higher density of states around the Fermi level.

By way of example only, laminate composite organic magnet compositions suitable for use in Spin-OPV devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, among others, plus a material, which has functions as a magnet and has certain band gaps for harvesting light from different spectral bands, for example, in the infrared, visible, and ultraviolet bands.

By way of example only, laminate composite organic magnet compositions suitable for use in MRAM/SPRAM devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, among others, plus other organic metallic materials, which have strong magnetic performance, for example, high magnetic ordering temperature (above about 100° C.) and significant coercive magnetic field at room temperature (greater than above 15 Oe).

By way of example only, laminate composite organic magnet compositions suitable for use in EMI Shielding devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, and other metallic materials, plus any other metallic and semi-metallic materials, including conducting polymers, since electrical conductivity is required but magnetic properties are not. By way of example, the electrical conductivity of the laminate may be provided by layers incorporating electrically conducting polymers, such as, dope polyaniline, doped polypyrrole, and doped polythiophene and their derivatives.

By way of example only, laminate composite organic magnet compositions suitable for use in Security: THz Imaging/Sensing devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, etc. plus a mixture with inorganic materials such as, GaAs, Si wafer, etc. Because of the combined electrical and magnetic properties, sufficiently thick films of these materials will be good absorbers of electromagnetic radiation encompassing a very broad spectral range, for instance, from the infrared frequencies through the ultraviolet frequencies and including the terahertz frequencies.

By way of example only, laminate composite organic magnet compositions suitable for use in Spin-LED devices may include: V[TCNE]x, V[TCNQ]x, V[TCNB]x, V[HCBD]x, V[TCEP]x, Co[TCNQ]x, Co[TCNB]x, Co[HCBD]x, Co[TCEP]x, Fe[TCNQ]x, Fe[TCNB]x, Fe[HCBD]x, Fe[TCEP]x, Cr[TCNE]x, Mn[TCNE]x, Ni[TCNE]x, etc., plus any magnetic materials and their mixture with organic based materials. By combining one embodiment of the invention with a LED material, the spin transport property allows the device to generate electroluminescence with circular polarization.

In order to facilitate a more complete understanding of the embodiments of the invention, the following non-limiting examples are provided.

Example 1

A V[TCNE]$_x$ laminate composite was formed on Si(111) wafers. A MLD device was utilized to deposit the laminate composite. The organic compound was TCNE from Sigma-Aldrich which was purified by sublimation with activated carbon before deposition. The metal-containing compound was V(CO)$_6$ which was synthesized according to known principles. Both compounds were stored in air-tight containers in an inert environment in a refrigerator at a temperature of about 40° C.

During deposition, the base pressure in the main chamber was about $10^{-5}$ torr as a result of pumping the chamber overnight. The deposition was started by opening a shut-off valve between the main chamber and a precursor cell that contained the $V(CO)_6$. The substrate was exposed to $V(CO)_6$ for about 50 s to deposit $V(CO)_6$. During $V(CO)_6$ deposition, the pressure was permitted to rise to about 0.5 to 1 torr.

Following $V(CO)_6$ deposition, the chamber was evacuated to remove excess $V(CO)_6$ and reaction by-products, like CO, and to reduce the pressure in the main chamber. The chamber was evacuated for about 100 s.

A layer of TCNE was then deposited on the previously deposited layer. The wafers were exposed to TCNE for about 300 s. Following deposition of the TCNE, the chamber was again evacuated, though for about 150 s.

Figure 3A:
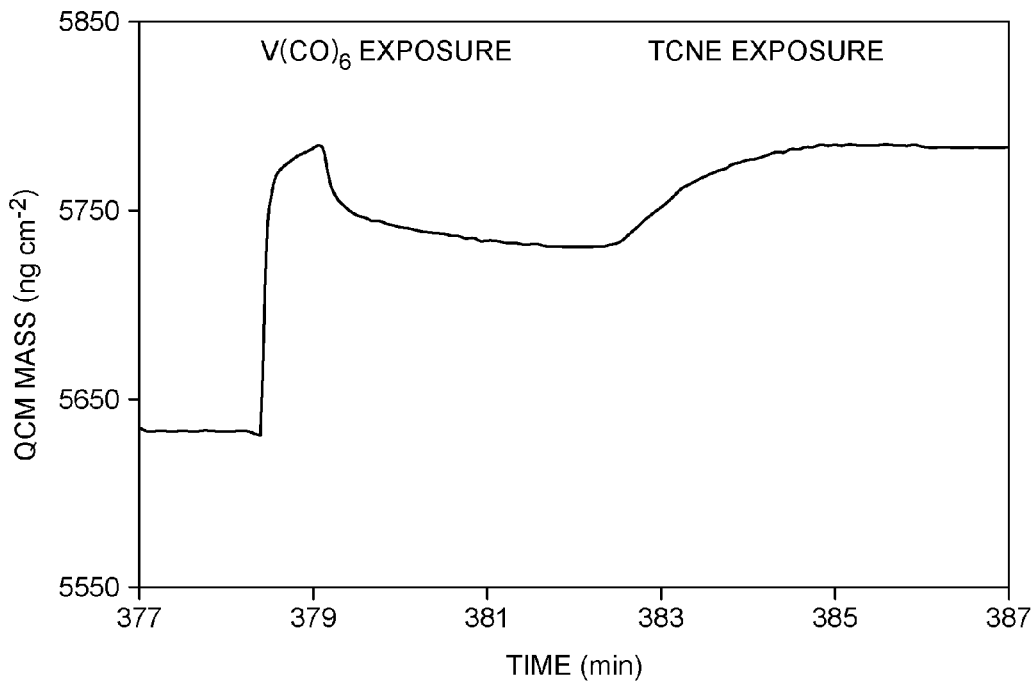
FIGS. 3A and 3B are plots of mass versus time taken with a quartz crystal microbalance (QCM) during one cycle and during several deposition cycles, according to one embodiment of the invention, respectively.
Figure 3B:
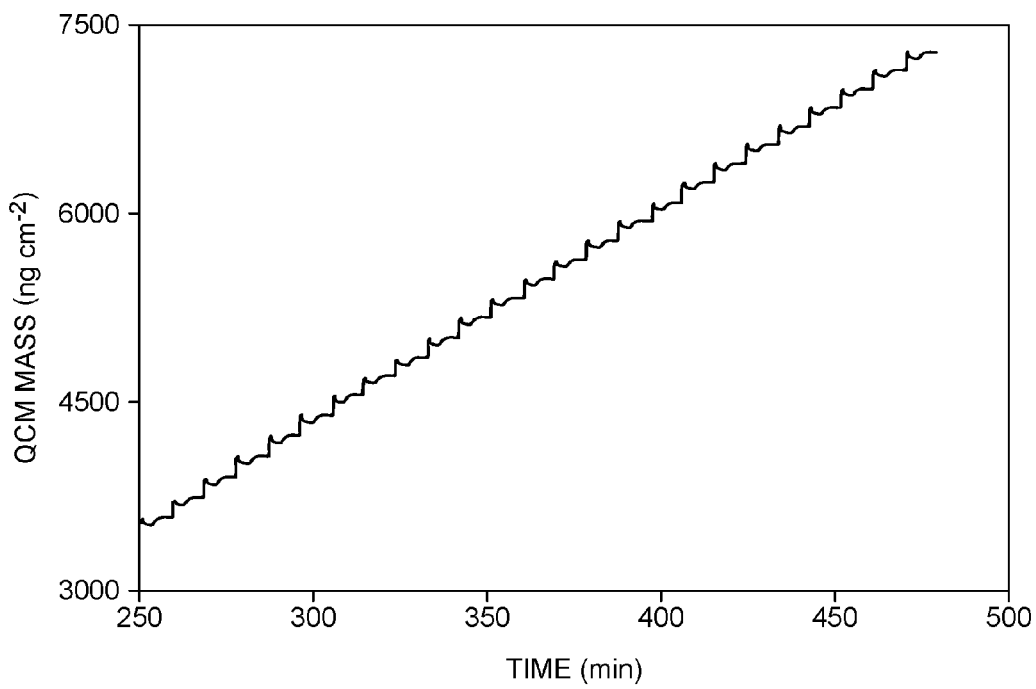

During deposition, growth was monitored by a quartz crystal microbalance (QCM) (a XTM/2 by Inficon with crystals purchased from Kurt J. Lesker Company). The growth is depicted in the plot of FIGS. 3A and 3B. By a total of 26 deposition cycles, the laminate composite of $V[TCNE]x$ was formed. FIGS. 3A and 3B depict the deposition of $V(CO)_6$ on the wafer at about 2½-3 minutes. After about 50 s, the valve is closed and the chamber is evacuated resulting in a drop in the mass observed over the period of about 100 s. The mass increases once again as the substrate is exposed to TCNE. FIG. 3B shows the progressive increase in mass on wafer for multiple cycles of the above described cycles.

Figure 4A:
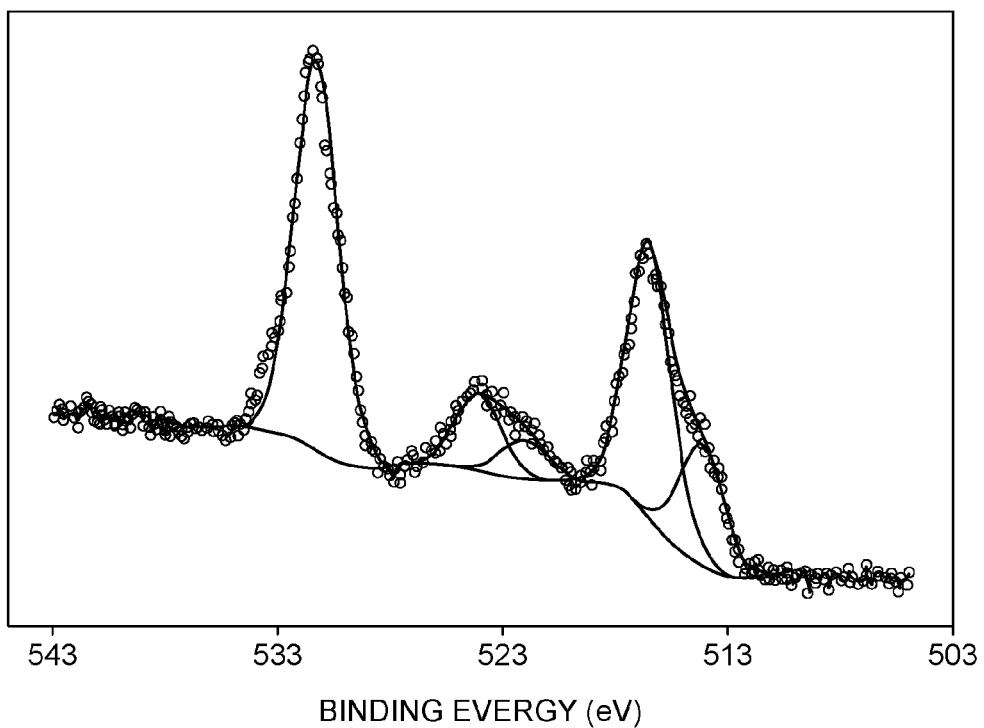
FIGS. 4A and 4B are plots of binding energy versus intensity from an x-ray photoelectron spectroscopy (XPS) study of one embodiment of the invention.
Figure 4B:
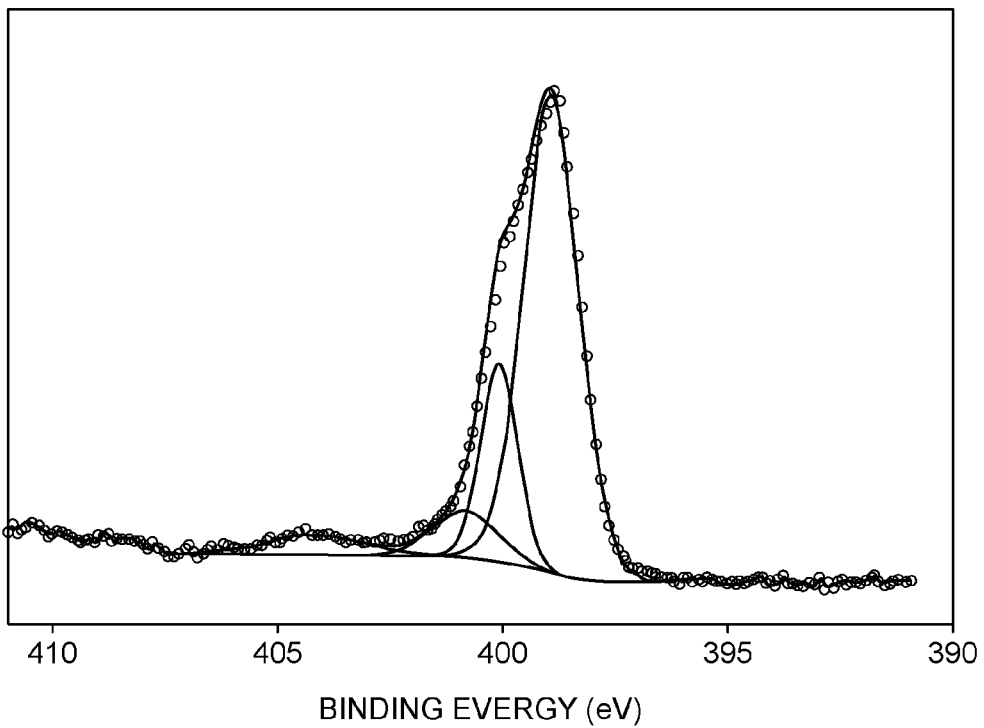
Figure 7A:
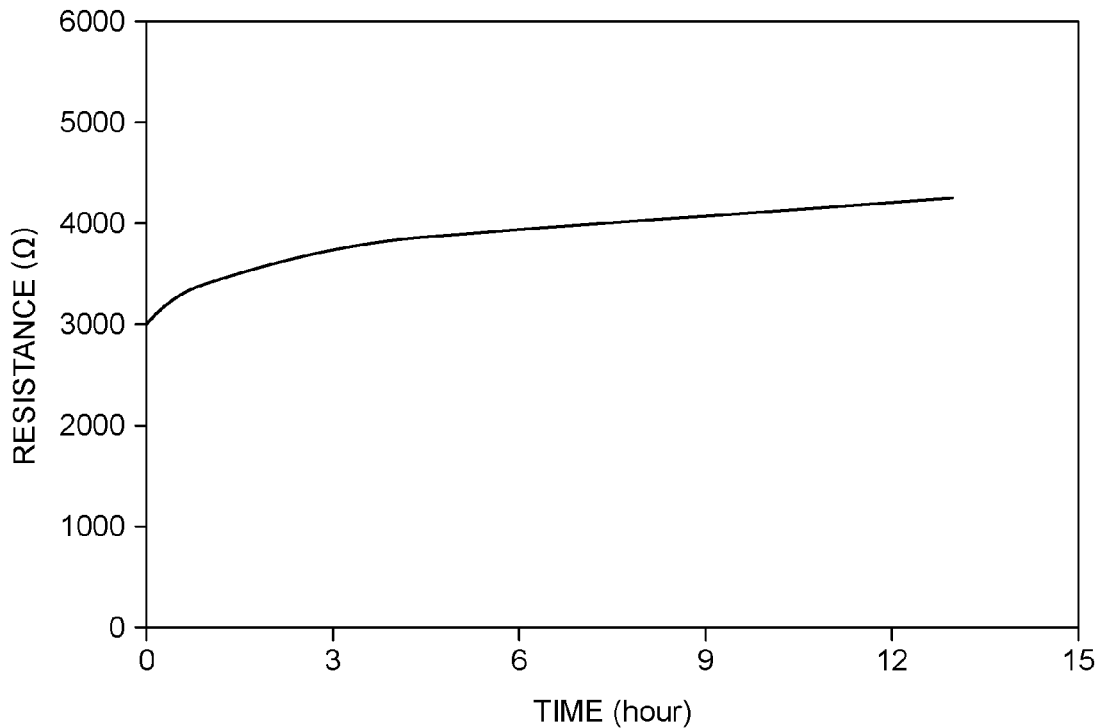
FIGS. 7A and 7B are plots of resistance versus hours and versus days, respectively, for one embodiment of the invention.
Figure 7B:
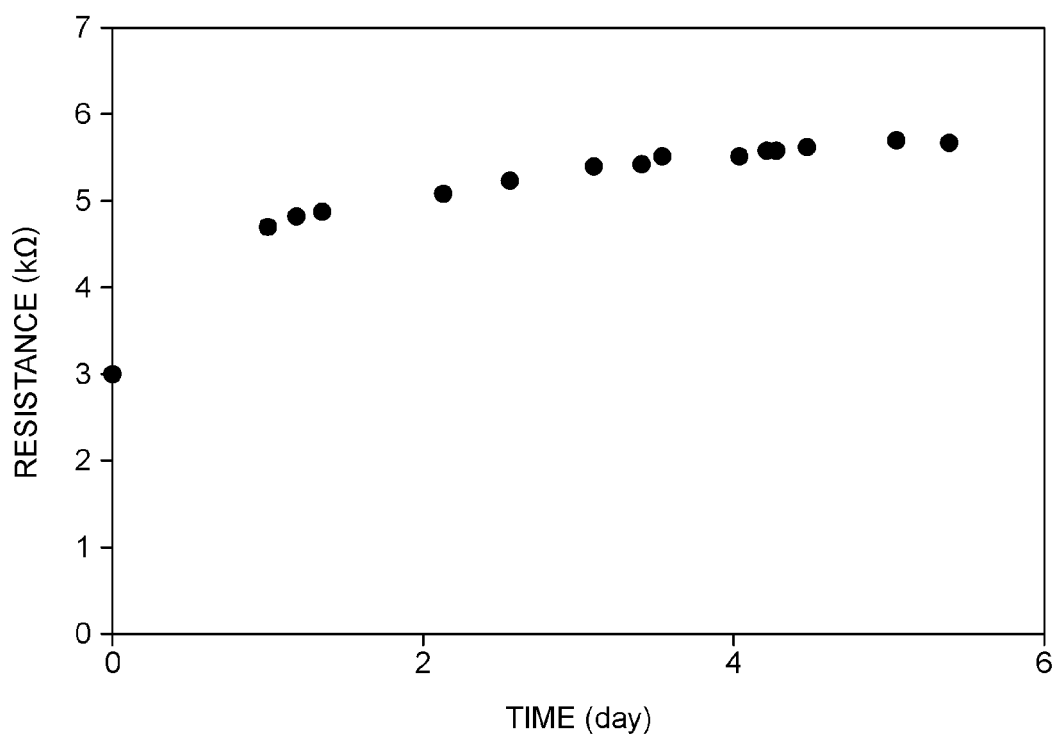
Figure 8:
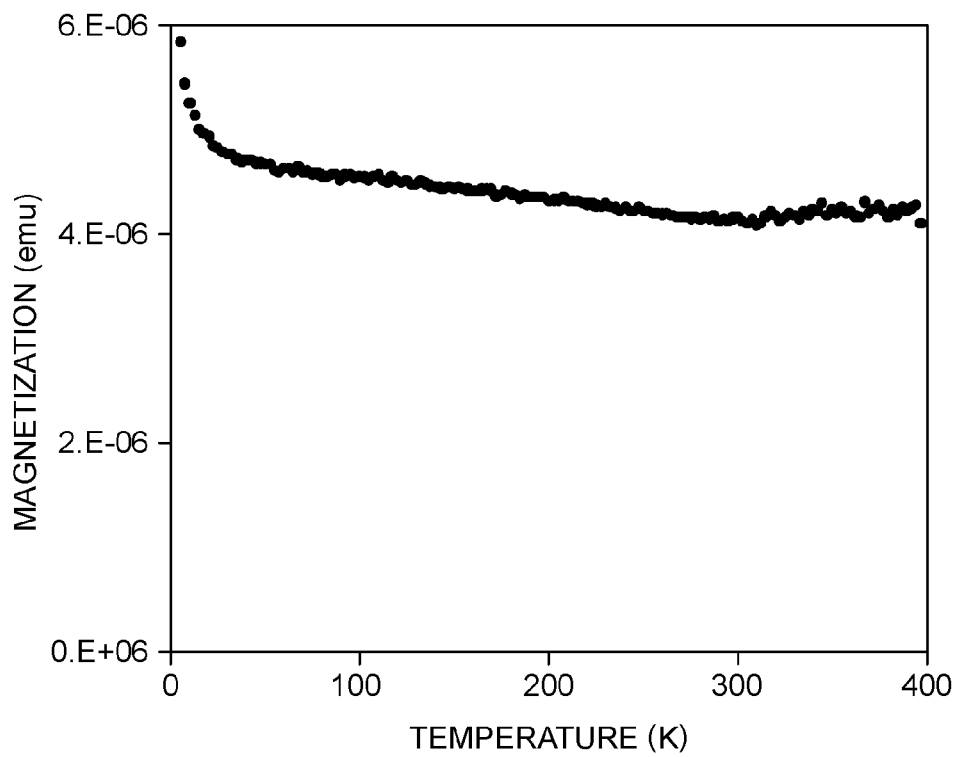
FIG. 8 is a plot of temperature versus magnetization for one embodiment of the invention.
Figure 9:
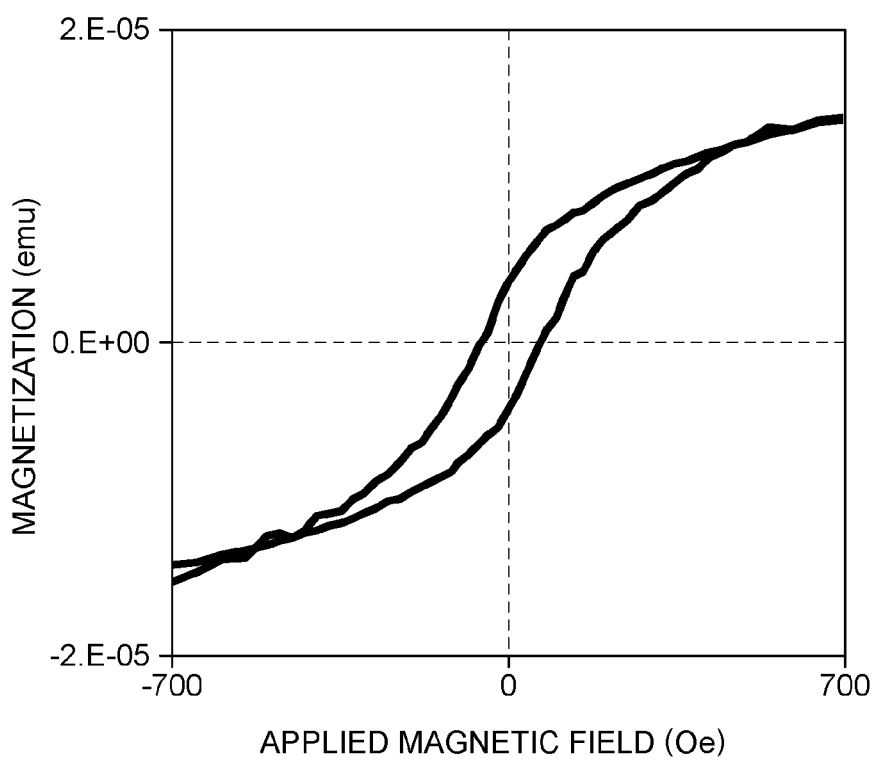
FIG. 9 is a plot of applied magnetic field versus magnetization for one embodiment of the invention.

After depositing, the chamber, which contained the laminate composite formed, was disconnected from the pumping line and moved into a glove box that was filled with inert gas, Ar. The chamber was then opened inside the Ar-filled box and the $V[TCNE]_x$ laminate composite was removed for examination of film thickness, roughness, chemical and physical properties. Chemical composition was determined by X-ray photoelectron spectroscopy (XPS), the data obtained is shown in FIGS. 4A and 4B. Other properties of the $V[TCNE]x$ laminate composite measured include the time dependent resistance, which is provided in FIGS. 7A and 7B. The magnetization as a function of temperature is provided in FIG. 8. The magnetization as a function of applied magnetic field is shown in FIG. 9

Example 2

A $Co[TCNE]_x$ laminate composite was deposited on Si(111) wafers in a similar sequence with the same MLD device to that of Example 1. In $Co[TCNE]_x$ deposition, $Co_2(CO)_8$ was used. After the deposition, the chamber was then transferred into the Ar-filled glove box for measurement.

Figure 5:
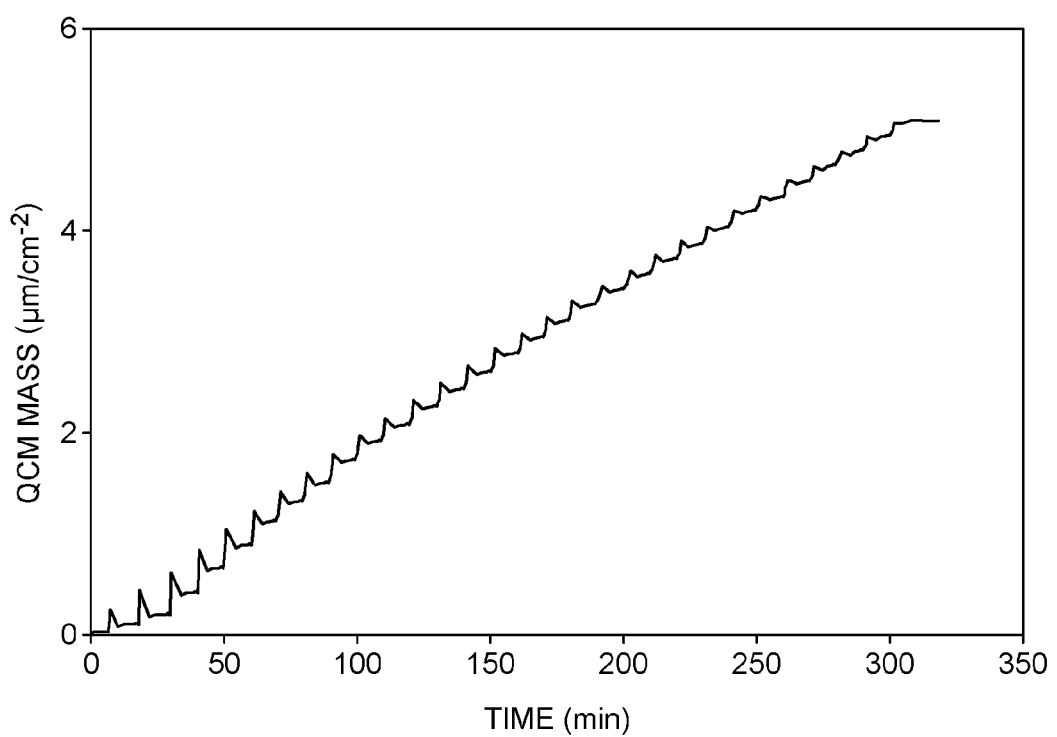
FIG. 5 is a plot of mass versus time taken with the QCM during several deposition cycles according to one embodiment of the invention.
Figure 6:
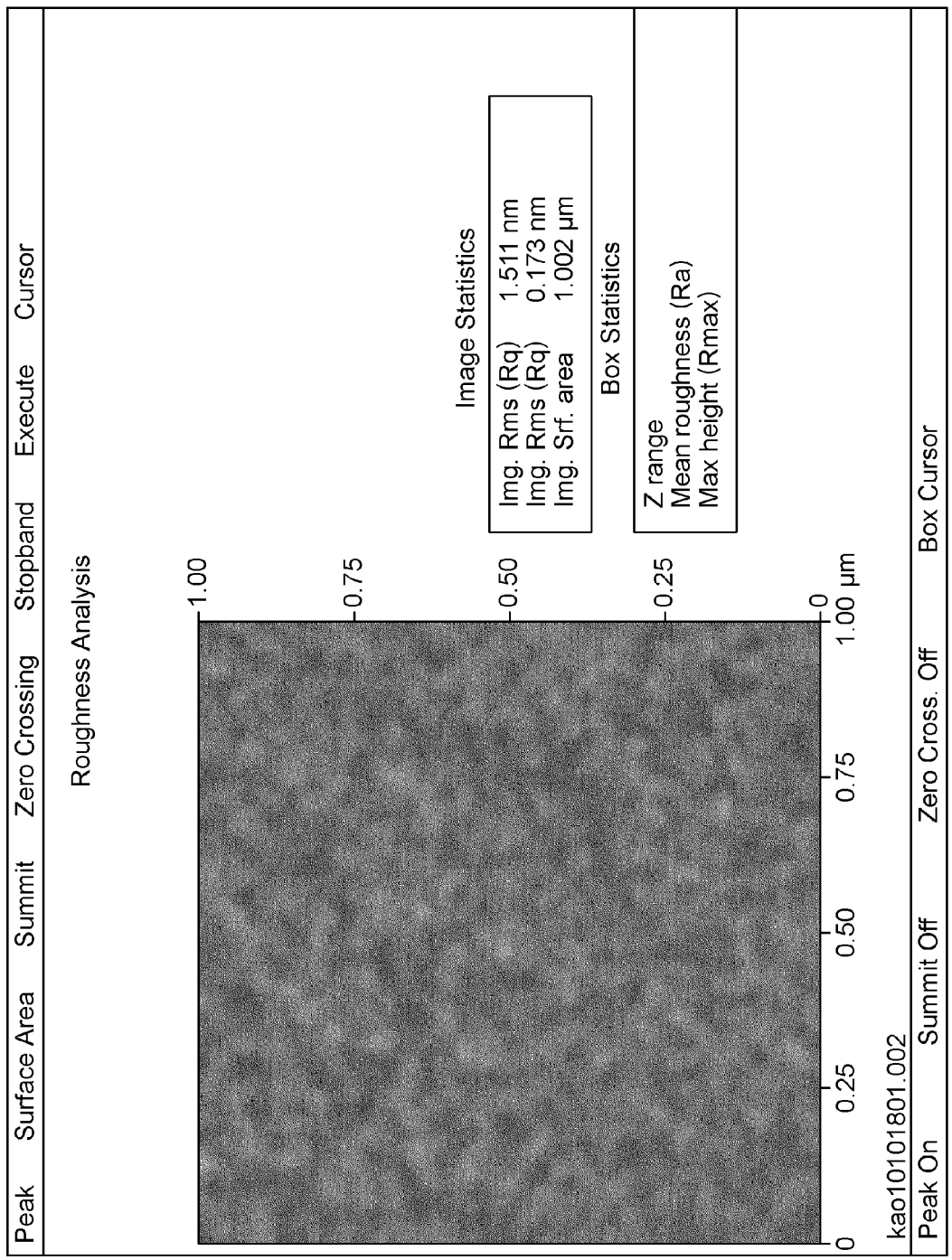
FIG. 6 is an image taken with an atomic force microscopic (AFM) of the surface of one embodiment of the invention.

The growth process was monitored by QCM and the result is shown in FIG. 5. As shown, the mass of the layers progressively increases with multiple cycles. The thickness of the resulting film was about 26 nm for a deposition of 30 cycles. Atomic force microscopy (AFM) was used to measure the roughness of the laminate. The RMS roughness was measured at about 0.17 nm and the image is shown in FIG. 6.

Example 3

A V-Co-TCNE laminate composite was deposited on Si(111) wafers in a similar sequence with the same MLD device to that of Example 1. In V-Co-TCNE deposition both $Co_2(CO)_8$ and $V(CO)_6$ were used. The sequence for deposition was $V(CO)_6$, TCNE, $Co_2(CO)_8$, TCNE, $V(CO)_6$, TCNE, $Co_2(CO)_8$, TCNE, and so on. After the deposition, the chamber was then transferred into the Ar-filled glove box for measurement.

Figure 10:
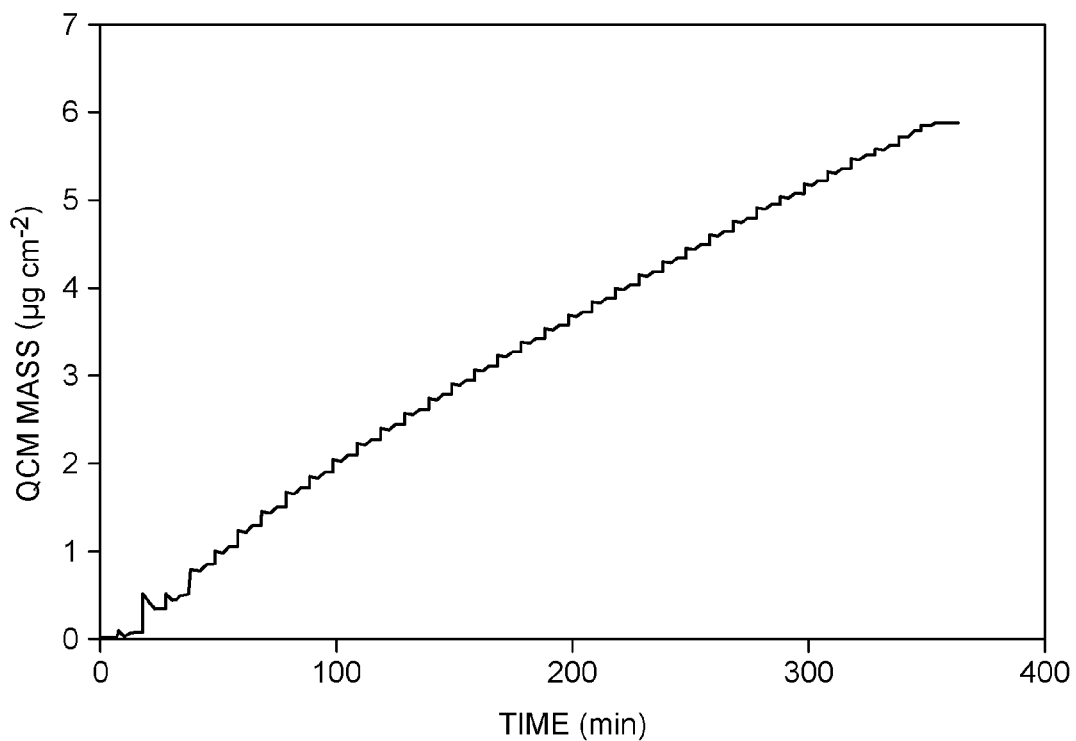
FIG. 10 is a plot of mass versus time taken with the QCM during several deposition cycles according to one embodiment of the invention.
Figure 11:
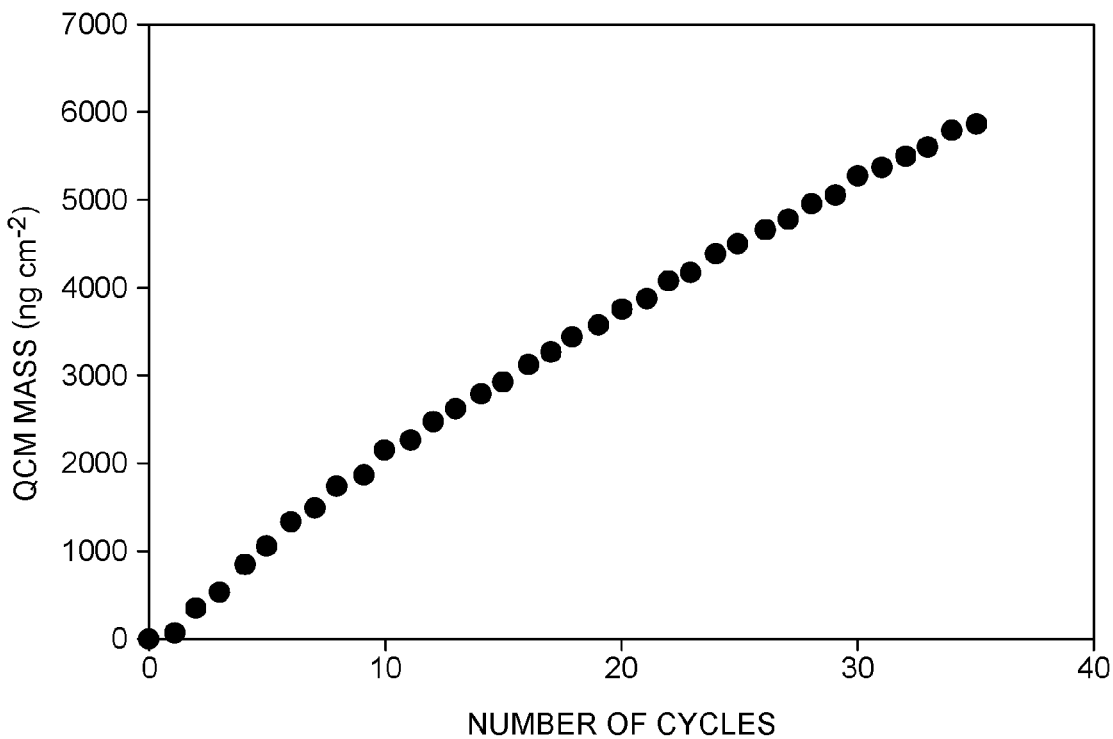
FIG. 11 is a plot of mass gain by number of cycles taken with the QCM during several deposition cycles according to one embodiment of the invention.
Figure 12:
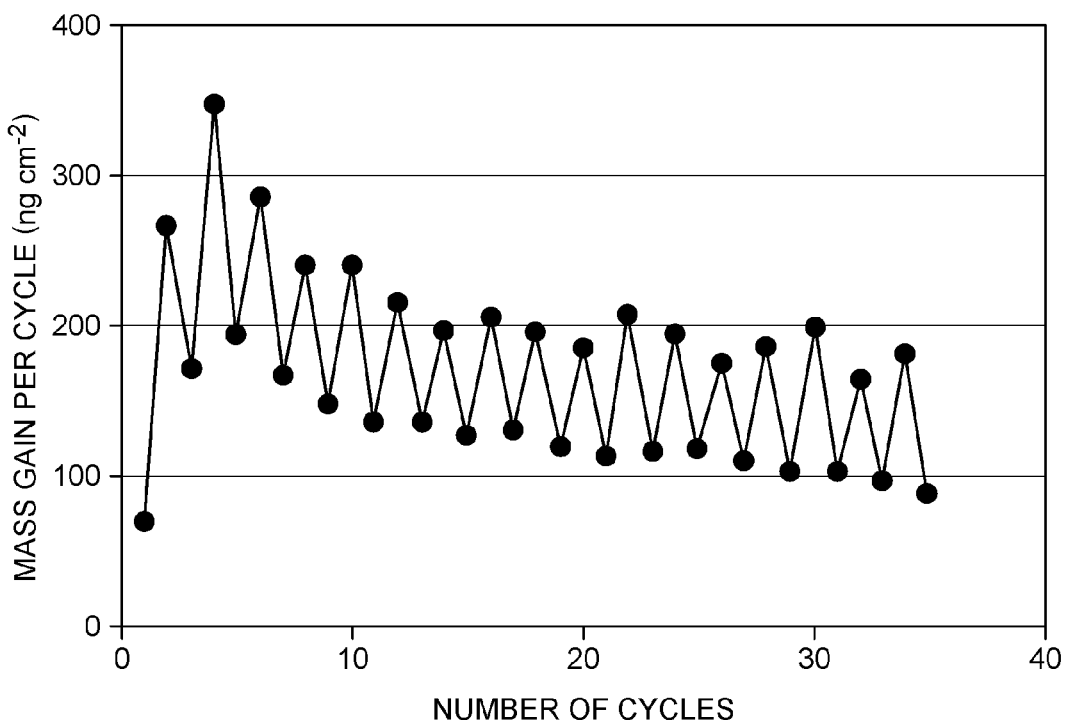
FIG. 12 is a plot of the mass gain per cycle taken with the QCM during several deposition cycles according to one embodiment of the invention.
Figure 13:
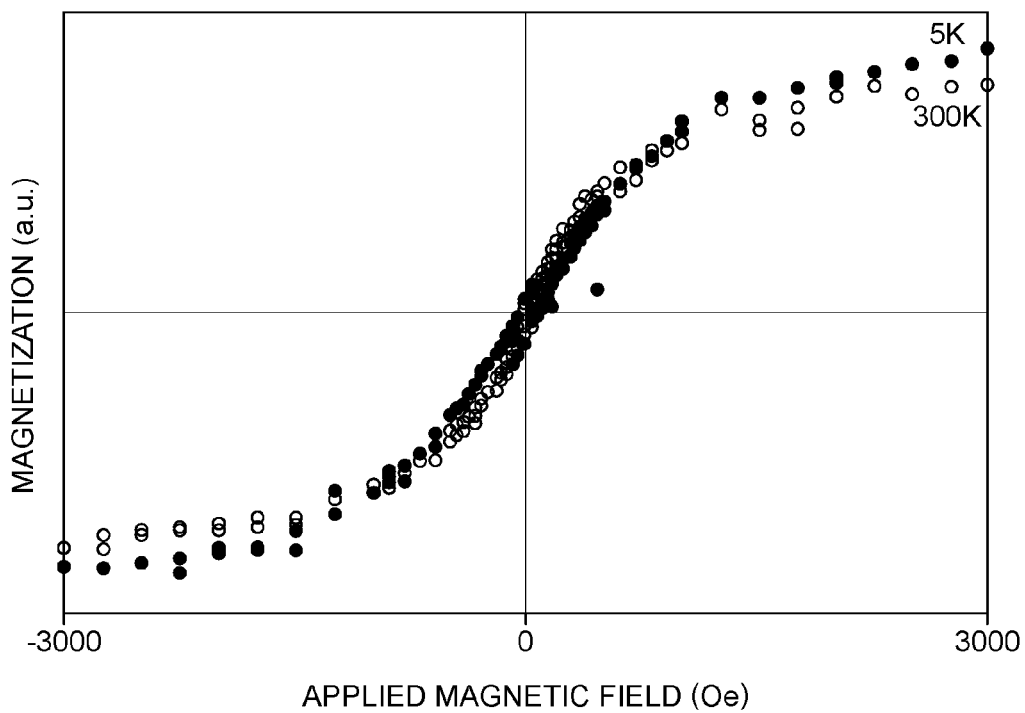
FIG. 13 is a plot of the magnetization versus applied magnetic field for one embodiment of the invention.
Figure 14:
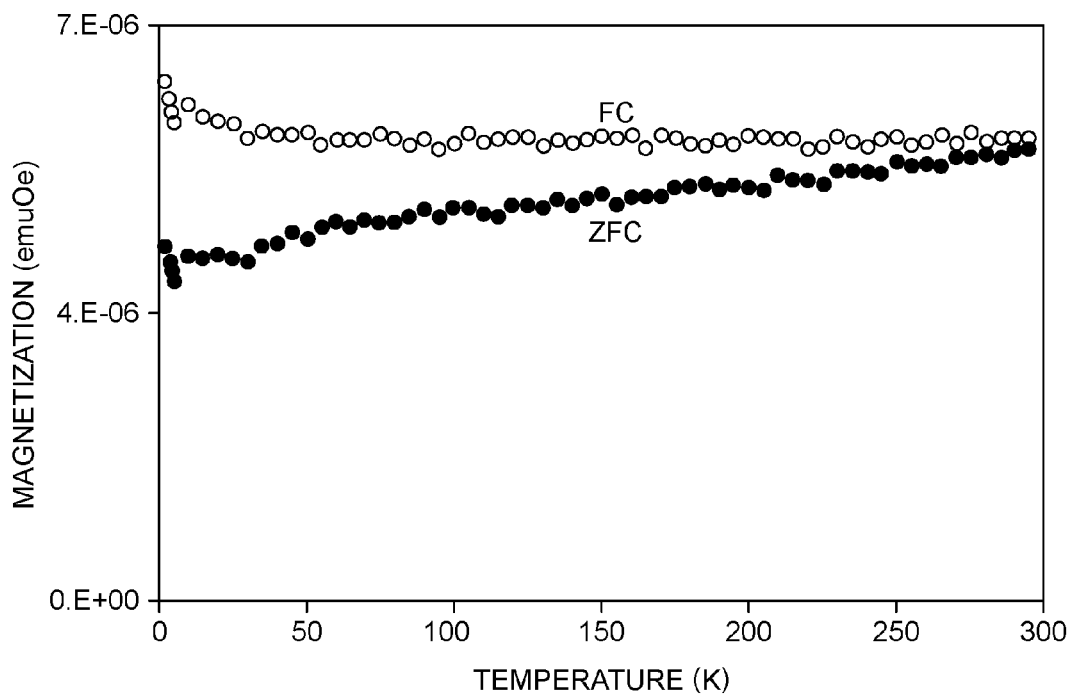
FIG. 14 is a plot of the magnetization versus as a function of temperature for one embodiment of the invention.

The growth process was monitored by QCM and the results are shown in FIGS. 10 and 11. As shown, the mass of the layers progressively increases with multiple cycles. Another mass gain plot is shown in FIG. 12 in which the mass gain per cycle is shown. The higher mass gain per cycle being during the deposition of Co[TCNE]. The magnetization of the V-Co-TCNE laminate composite as a function of applied magnetic field and measured parallel to the longitudinal axis of the composite is shown in FIG. 13. Of the overlapping hysteresis, one is at 5 K and the other is at 300 K as is indicated in FIG. 13. FIG. 14 depicts the magnetization as a function of temperature for the V-Co-TCNE laminate composite. As indicated, the upper curve indicates temperature dependence of a field-cooled (FC) pre-condition to measurement and the lower curve indicates the temperature dependence of a zero field-cooled (ZFC) pre-condition to measurement.

By comparison, it has been observed that layers deposited by chemical vapor deposition (CVD) and physical vapor deposition (PVD) are defective in one way or another. As such, it was found that the properties of layers deposited by such processes are insufficient for use in spintronics devices generally. For instance, CVD and PVD layers are relatively thin and may contain pinholes or other defects that inhibit the use of layers formed from CVD or PVD in spintronic applications. Similarly, depositing layers by CVD and PVD is difficult to control and may not be scalable for commercial purposes.

In contrast, it has been observed with regard to MLD that the thickness of layers 22, 24 and, consequently, the thickness and uniformity of the monolayer 12 formed therefrom may be controlled more precisely. In this regard, the monolayer 12 may be pinhole free. As such, the properties of the laminate composite 10 made via MLD are improved over composites of similar materials made by CVD or PVD. For example, MLD deposited layers may be characterized by a higher density (about 1.5 times higher), a higher conductivity (about $10^5$ times higher), and a higher curie temperature ($T_c$) of magnetic ordering of greater than about 400 K than similarly composed CVD layers. In addition, the laminate composite 10 deposited via MLD may have greater stability in air and better surface uniformity and fewer pinholes at comparable thicknesses than similarly composed CVD layers. A comparison of the coercivity for V-TCNE polymeric complexes deposited via CVD, from a solution with a powder, via PVD, and via MLD and measured at specific temperatures is provided in Table 1. Table 1 also provides a comparison of the measured magnetic order temperature for each of the same materials.

TABLE 1

| | Coercivity/Oe (Temperature, K) | Magnetic order temperature (K) |
| --- | --- | --- |
| CVD ($V(CO)_6$) | 8.5(5 K), 4(300 K) | 370 K |
| CVD ($V(C_6H_6)_2$) | 10(5 K), 80(300 K) | 320 K |
| Solution ($CH_2Cl_2$) | 8(5 K), 60(300 K) | 350 K |
| PVD | 65(200 K) | 365 K |
| MLD | ≥80(5-400 K) | >400 K |

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details and illustrative examples shown and described. Accordingly, departures may be made from such details without departing from the scope of the general inventive concept.

What is claimed is:

1. An organic-based magnet formed by molecular layer deposition of a first compound and molecular layer deposition of a second compound, said first compound or said second compound including a metal-containing compound and said first compound and said second compound being reactive with each other to form a first layer organic-based magnet, including a first metal, and a second layer organic magnet deposited by molecular layer deposition on said first layer organic magnet, the second layer organic magnet including a second metal different from the first metal.

2. A laminate composite comprising:
a first monolayer including a first metal bonded to a first magnet-forming organic compound;
a second monolayer in direct contact with the first monolayer, the second monolayer including a second metal, different from the first metal, bonded to a second magnet-forming organic compound, at least one of the first monolayer and the second monolayer having an induced magnetization when exposed to a magnetic field.

3. The laminate composite of claim 2 wherein the first metal and the second metal are transition metals or rare earth metals.

4. The laminate composite of claim 2 wherein the first metal and the second metal are selected from vanadium and cobalt.

5. The laminate composite of claim 2 wherein at least one of the first organic compound and the second organic compound includes at least a portion of one of tetracyanoethylene, tetracyanoquinodimethane, tetracyanobenzene, tetracyanopyrazine, hexacyanobutadiene, methyltricyanoethylenecarboxylate, 2-(x-fluorophenyl)-1,1,2-tricyanoethylene, (x:-, di-, tri-, tetra-, penta-), (i-hexacyanodivinylbenzene), or 3,3'-di-(1,1,2-tricyanovinyl)azobenzene or a combination thereof.

6. The laminate composite of claim 2 wherein the first monolayer and/or the second monolayer is about one metal-organic molecule thick.

7. The laminate composite of claim 2 further comprising:
an associating element layer on the second monolayer or between the first monolayer and the second monolayer.

8. The laminate composite of claim 7 wherein the associating element layer includes one of oxygen, nitrogen, sulfur, selenium, arsenic, phosphorous, chlorine, fluorine, aluminum, gold, silver, a rare earth metal, an alkali earth metal, an alkali metal, or a transition metal or a combination thereof.

9. The laminate composite of claim 2 further comprising:
a third monolayer on the second monolayer, the third monolayer including the same metal and the same organic compound as the first monolayer or the second monolayer.

10. The laminate composite of claim 9 further comprising:
a fourth monolayer on the third monolayer.

11. The laminate composite of claim 2 further comprising:
a substrate of silicon, germanium, quartz, sapphire, glass, GaAs, GaN, polyimides, PET, PE, PS, PMMA, PEO, PC, PEN, or PTFE or a combination thereof, one of the first monolayer and the second monolayer being in contact with the substrate.

12. A device comprising:
the laminate composite of claim 2, and
a nonmagnetic film on the laminate composite.

13. The laminate composite of claim 2 incorporated into one of the following devices a Spin-OPV device, a thermoelectric device, a MRAM/SPRAM device, an EMI shielding device, a security and imaging and sensing device, and a Spin-LED device.

14. A laminate composite on a substrate comprising:
a first monolayer on the substrate including a first metal from a first metal-containing compound reacted on the substrate with a first organic compound from a first organic-containing compound; and
a second monolayer on the first monolayer, the second monolayer being a discrete, distinguishable monolayer from the first monolayer and including a second metal from a second metal-containing compound reacted on the first monolayer with a second organic compound from a second organic-containing compound, at least one of the first monolayer and the second monolayer having an induced magnetization when exposed to a magnetic field.

15. The laminate composite of claim 14 wherein the first metal and the second metal are transition metals, electron-enriched transition metals, and/or rare earth metals.

16. The laminate composite of claim 14 wherein the first metal and/or the second metal is vanadium and/or cobalt or a mixture of vanadium and cobalt.

17. The laminate composite of claim 14 wherein at least one of the first organic compound and the second organic compound includes one of tetracyanoethylene, tetracyanoquinodimethane, tetracyanobenzene, tetracyanopyrazine, hexacyanobutadiene, methyltricyanoethylenecarboxylate, 2-(x-fluorophenyl)-1,1,2-tricyanoethylene, (x:-, di-, tri-, tetra-, penta-), (i-hexacyanodivinylbenzene), or 3,3'-di-(1,1,2-tricyanovinyl)azobenzene or a combination thereof.

18. The laminate composite of claim 14 wherein the first monolayer and/or the second monolayer is about one metal-organic molecule thick.

19. The laminate composite of claim 14 wherein the first metal is different from the second metal.

* * * * *